(12) United States Patent
Liu et al.

(10) Patent No.: US 6,650,146 B2
(45) Date of Patent: Nov. 18, 2003

(54) DIGITAL FREQUENCY COMPARATOR

(75) Inventors: Yin-shang Liu, Nan Tou (TW); Kuo-sheng Huang, Kao Hsiung (TW); Hung-chih Liu, Hsin Chu (TW)

(73) Assignee: Silicon Integrated Systems Corporation (TW)

( * ) Notice: Subject to any disclaimer, the term of this patent is extended or adjusted under 35 U.S.C. 154(b) by 30 days.

(21) Appl. No.: 10/006,295

(22) Filed: Dec. 6, 2001

(65) Prior Publication Data

US 2002/0135400 A1 Sep. 26, 2002

(30) Foreign Application Priority Data

Mar. 20, 2001 (TW) ........................................ 90106548 A

(51) Int. Cl.[7] .............................................. H03D 13/00
(52) U.S. Cl. .......................................... 327/43; 327/49
(58) Field of Search ............................. 327/39–47, 49, 327/23, 24

(56) References Cited

U.S. PATENT DOCUMENTS

| | | | | | |
|---|---|---|---|---|---|
| 3,714,463 A | * | 1/1973 | Laune | ............................ | 327/5 |
| 5,793,236 A | * | 8/1998 | Kosco | ........................ | 327/218 |
| 6,055,286 A | * | 4/2000 | Wu et al. | ................... | 375/375 |
| 6,366,135 B1 | * | 4/2002 | Dalmia et al. | ................. | 327/12 |

OTHER PUBLICATIONS

M. Soyeur et al., "*A 1.6Gb/s CMOS Phase–Frequency Locked Loop for Timing Recovery*", 1995 IEEE, pp. 187–189, IBM Research Center, Yorktown Heights, NY.

\* cited by examiner

*Primary Examiner*—Timothy P. Callahan
*Assistant Examiner*—Cassandra Cox
(74) *Attorney, Agent, or Firm*—Martine & Penilla, LLP

(57) ABSTRACT

A digital frequency comparator includes two double-edge triggered flip-flops and a combination logic. Each of the double-edge triggered flip-flops includes two D-type flip-flops and two multiplexers. The first D-type flip-flop receives a first reference clock pulse and is triggered by a data signal. The second D-type flip-flop receives the first reference clock pulse and is triggered by the reverse of the data signal. The first multiplexer provides the output of the first D-type flip-flop when the data signal is 1 and the output of the second D-type flip-flop when the data signal is 0. The second multiplexer provides the output of the first D-type flip-flop when the data signal is 0 and the output of the second D-type flip-flop when the data signal is 1. The combination logic enables an UP pulse when the data signal transmission clock is faster in frequency than the first reference clock signal.

8 Claims, 6 Drawing Sheets

DIGITAL FREQUENCY COMPARATOR

BACKGROUND OF THE INVENTION (a) Field of the Invention

The invention relates to a digital frequency comparator and, more particularly, to a frequency comparator employing relatively few elements for clock-pulse recovery with "non-return-to-zero data"

(b) Description of the Related Art

FIG. 1 shows the clock-pulse of a phase-frequency locked loop 100 of non-return zero (NRZ) data with respect to the conventional technique, as described in Mehmet Soyuer, Herschel A. Ainspan and John F. Ewen, "A1.6 Gb/s Phase-Frequency Locked Loop For Timing Recovery", IEEE International Symposium on Circuits and System, Vol. 1, 1995 p.p. 187–190.

The phase-frequency locked loop 100 includes a digital phase-frequency detector (DPFD) 101, charge pumps/loop filters (CPF) 102 and 103, a V-I converter 104, and a voltage-controlled oscillator (VCO) 105. It is to be noted that the V-I converter usually is part of the VCO. However, the V-I converter is shown explicitly in FIG. 1, thus the 105 actually is a current-controlled oscillator. Besides, the resistor and capacitor are part of the loop filter shown explicitly.

The digital phase-frequency detector 101 is used to receive NRZ data and the output of the clock pulse of the voltage-controlled oscillator 105, and output the control signal UP or DOWN to the charge pump/loop filter 102 in the case of either the output clock pulse frequency being lower or higher than the transmission frequency of the data signal. The charge pump/loop filter 102 outputs a control voltage to the voltage-controlled oscillator 105 based on the control signal UP or DOWN, so as to control the output clock pulse of the voltage-controlled oscillator 105. The phase-locked loop 100 generates a reference clock pulse synchronized with the NRZ data to latch the time latch 106 in order to output accurate data.

FIG. 2 shows the circuit diagram of the phase-frequency detector 101 of FIG. 1. As shown in FIG. 2, the phase-frequency detector 101 includes eight flip-flops 1011, four NOR gates 1012 and two OR gates 1013. The eight flip-flops 1011 are connected in series and are divided into four groups. Each of the output signals generates the control signal UP or DOWN via the logic circuit of NOR gate 1012 and OR gate 1013. The design of the flip-flop requires relatively more logic gates combination and contains a time sequence control signal. Thus, if the number of the flip-flops can be reduced, the logic elements can also be decreased so as to lower the production cost, and the response speed is also increased.

SUMMARY OF THE INVENTION

Accordingly, it is an object of the invention to provide a digital frequency comparator having relatively few elements being used in the non-return zero data transmission for clock pulse recovery.

Another object of the invention is to provide a digital frequency comparator which requires relatively few elements for clock-pulse recovery and lowers the cost of production and also increases the processing speed.

To attain the above-mentioned objects, the invention provides a digital frequency comparator including a first double-edge triggered D flip-flop, a second double-edge triggered D flip-flop, and a combination logic. Firstly, the first double-edge triggered D flip-flop receives a data signal and a first reference clock signal, then makes use of the positive-and-negative triggering to output a first state signal and a second state signal of the first reference clock signal. Secondly, the second double-edge triggered D flip-flop receives a data signal and a second reference clock signal, then makes use of the positive-and-negative triggering to output a first state signal and a second state signal of the second reference clock signal. The phase angle of the second reference clock signal is 90-degree lagging behind the phase angle of the first reference clock signal. Lastly, the combination logic receives the first state signal and the second state signal of the first double-edge triggered D flip-flop and the second double-edge triggered D flip-flop. Afterward, the combination logic enables an UP pulse when the frequency of the data signal transmission clock is faster than the frequency of the first reference clock signal. Conversely, the combination logic enables a DOWN pulse when the frequency of the data signal transmission clock is slower than the frequency of the first reference clock signal.

The first double-edge triggered flip-flop includes a first D-type flip-flop, a second D-type flip-flop, a first multiplexer, and a second multiplexer. The first D-type flip-flop has a D-input end receiving the first reference clock pulse. The data signal is used as the positive trigger. The second D-type flip-flop has a D-input end receiving the first reference clock pulse. The reverse of the data signal is used as the positive trigger. The first multiplexer connects to the Q output ends of the first D-type flip-flop and the second D-type flip-flop. Using the reverse of the data signal as a selecting signal, the first multiplexer provides the output of the first D-type flip-flop when the data signal is 1, and the output of the second D-type flip-flop when the data signal is 0. The second multiplexer connects to the Q output ends of the first D-type flip-flop and the second D-type flip-flop. Using the data signal as a selecting signal, the second multiplexer provides the output of the first D-type flip-flop when the data signal is 0, and the output of the second D-type flip-flop when the data signal is 1.

The invention can improve the processing speed with a high bit rate at relatively low cost since the invention uses the very simple combination logic and the double-edge triggered D flip-flops.

Other objects and advantages of the invention will become more apparent from the following description taken in conjunction with the accompanying drawings.

DETAILED DESCRIPTION OF THE INVENTION

Figure 3:
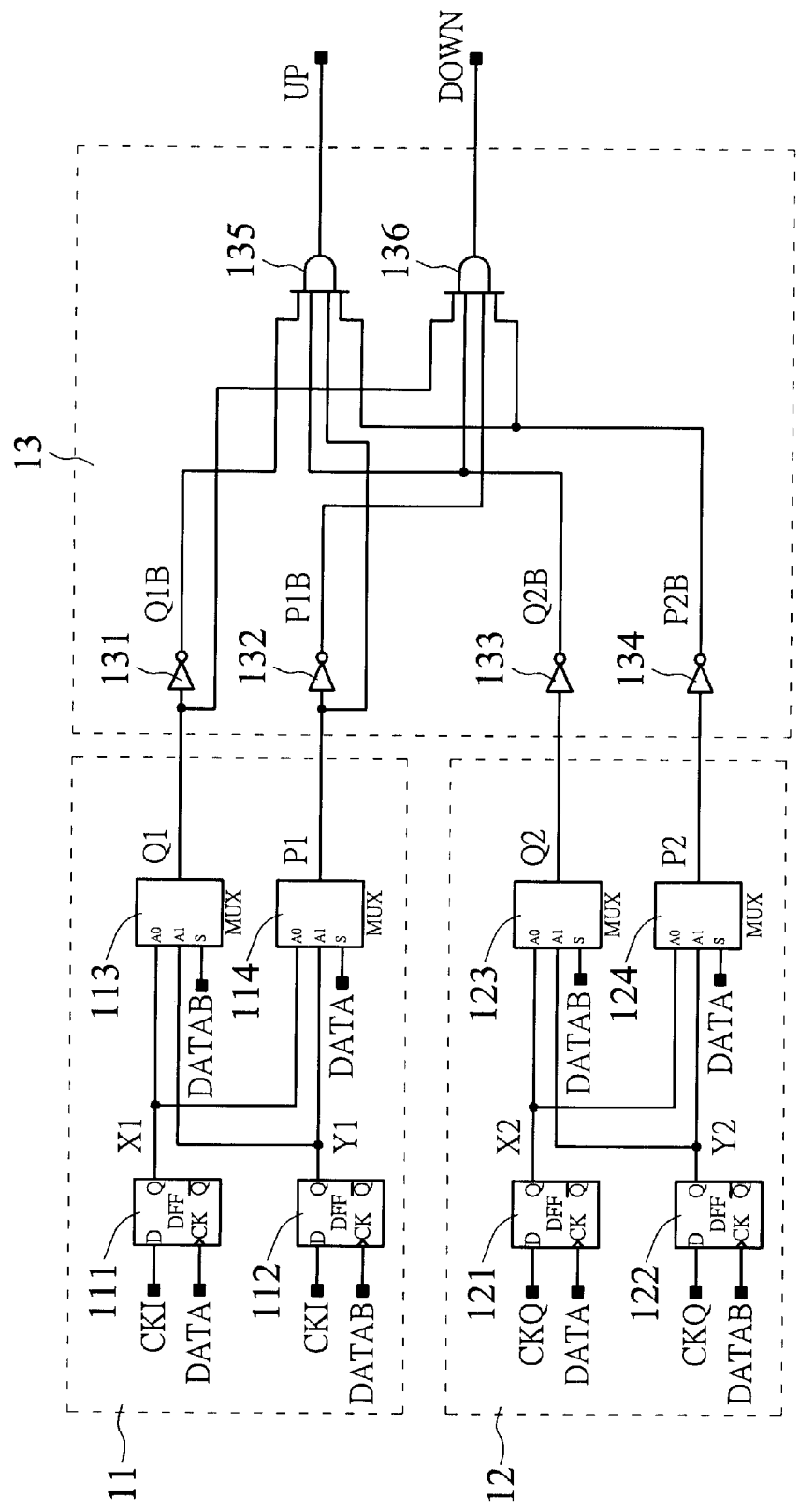
FIG. 3 is a circuit diagram of the digital frequency comparator of the invention.

In FIG. 3, a circuit diagram of the digital frequency comparator of the preferred embodiment is shown. The frequency comparator 10 includes two double-edge triggered D-type flip-flops 11, 12 and a logic circuit 13. As shown in FIG. 3, the structures of the double-edge triggered D-type flip-flops 11 and 12 are identical, the only difference is that the signals received are not the same. The flip-flop 11 receives signals of the reference clock pulse CKI, and the data signal DATA is used as the trigger signal. The flip-flop 12 receives signals of the reference clock pulse CKQ and the data signal DATA is used as the trigger signal. The reference clock pulse CKI and reference clock pulse CKQ are reference clock pulses outputted by the voltage-controlled oscillator and the reference clock pulse CKQ lags behind the reference clock pulse CKI by 90 degrees (referring to FIG. 4).

After the flip-flop 11 is triggered by the data signal DATA, signals Q1 and P1 are outputted. Here, the Q1 signal is at the state of the reference clock pulse CKI at the current triggering edge of the data signal DATA, and the PI signal is at the state of reference clock pulse CKI at the previous triggering edge of the data signal DATA. After the flip-flop 12 is triggered by the data signal DATA, Q2 and P2 signals are outputted. Here, the Q2 signal is at the state of the reference clock pulse CKQ at the current triggering edge of the data signal DATA, and the P2 signal is at the state of the reference clock pulse CKQ at the previous triggering edge of the data signal DATA.

Figure 1:
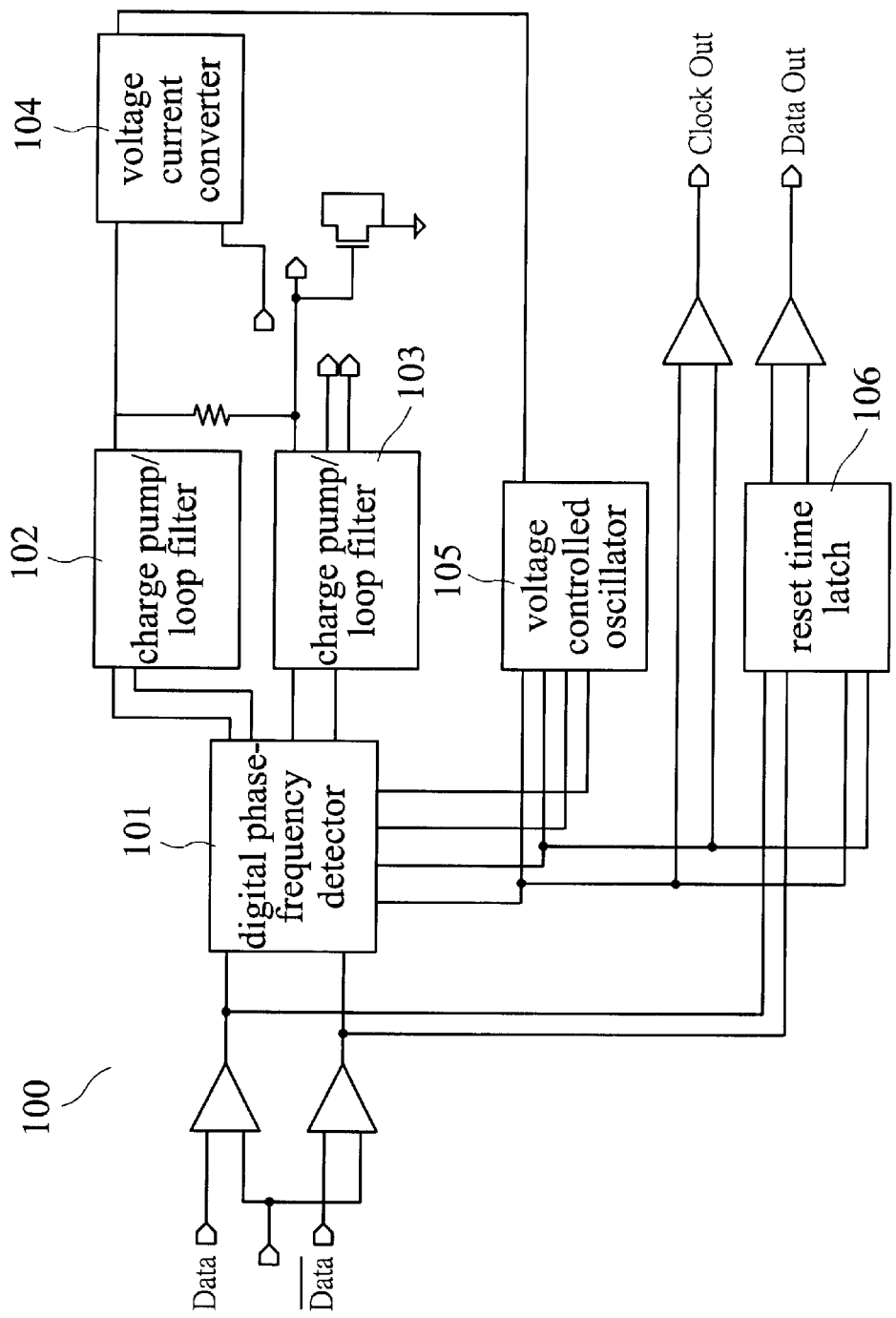
FIG. 1 is a block diagram of phase-frequency locked-loop for the non-return zero data according to the prior art.
Figure 2:
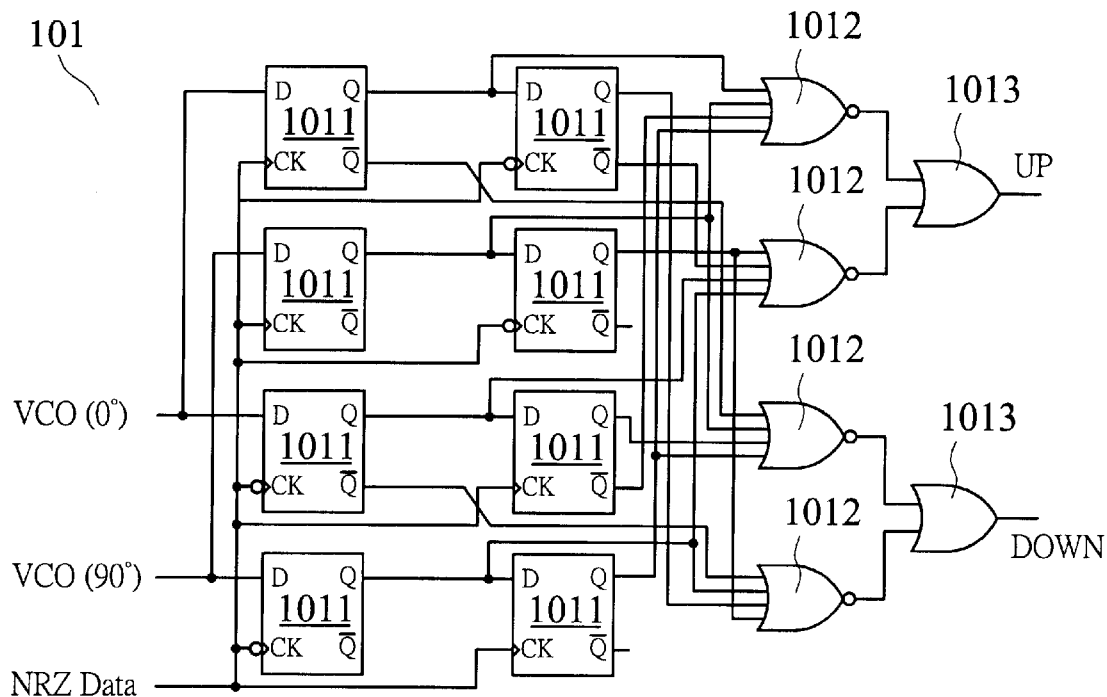
FIG. 2 is a circuit diagram of the phase-frequency detector according to the prior art.

The logic circuit 13 receives P1, Q1, P2 and Q2 signals, and when the frequency of the reference clock pulse CKI is lower than the transmission frequency of the data signal DATA, the control signal UP is asserted. When the frequency of the reference clock pulse CKI is higher than the transmission frequency of the data signal DATA, the control signal DOWN is asserted. These control signals UP, DOWN can control the output voltage of the charge pump/loop filter (referring to FIG. 1) so as to control the output frequency of the voltage-controlled oscillator.

Referring again to FIG. 3, the double-edge triggered D-type flip-flop 11 includes two positive trigger D-type flip-flops 111, 112 and two multiplexers 113, 114. The input end D of the flip-flop 111 receives the reference clock pulse CKI while the trigger end CK receives the data signal DATA. In addition, the output end Q of the flip-flop 111 outputs to the input end A0 of the multiplexers 113, 114. The input end D of the flip-flop 112 receives the reference clock pulse CKI while the trigger end CK receives the inverse signal clock pulse DATAB of the data signal DATA. In addition, the output end Q of the flip-flop 112 is outputted to the input end of the multiplexers 113, 114. The selection signal S of the multiplexer 113 is controlled by the inverse signal clock pulse DATAB, and the selection signal S of the multiplexer 114 is controlled by the data signal DATA.

Thus, when the data signal DATA is changed from "0" to "1", the output X1 of the flip-flop 111 is at the state of the reference clock pulse CKI at the current triggering edge of DATA, and the state is outputted to become Q1 by the multiplexer 113. At this moment, the signal of the flip-flop 112 outputted from the multiplexer 114 is at the state of the reference clock pulse CKI latched by the flip-flop 112 when the previous data signal DATA changed from "1" to "0". When the data signal DATA is changed from "1" to "0", the output Y1 of the flip-flop 112 is at the state of the reference clock pulse CKI at the current triggering edge of DATA, and this state is outputted through the multiplexer 113 to become Q1. At this moment, the signal of the flip-flop 111 outputted from the multiplexer 114 is at the state of the reference clock pulse CKI latched by the flip-flop 111 when the previous data signal DATA changed from "0" to "1".

Since the only difference between the double-edge triggered D-type flip-flop 12 and the double-edge triggered D-type flip-flop 11 is the receiving of the reference clock pulse, and the structures of both of the flip-flops 12 and 11 are identical, repeated illustration on their structure is not necessary except that the double-edge triggered D-type flip-flop 12 receive the reference clock pulse CKQ.

Next, the logic circuit 13 includes four inverters 131, 132, 133 and 134 and two AND gates 135, 136. The four inverters 131, 132, 133 and 134 receive Q1, P1, Q2 and P2 signals and output Q1B, P1B, Q2B and P2B signals, respectively. The AND gate 135 receives Q1B, Q2B, P1 and P2B signal and outputs as control signal UP. The AND gate 136 receives Q1, Q2B, P1B and P2B signals and outputs as control signal DOWN.

Figure 4:
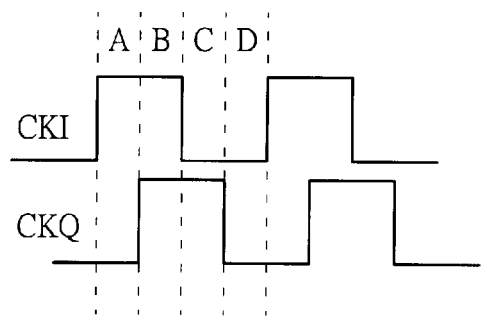
FIG. 4 shows the input reference clock signal of the digital frequency comparator of FIG. 3 of the invention.

Referring to FIG. 4, the reference clock pulse CKQ lags behind the reference clock pulse CKI by 90 degrees, therefore each period of the reference clock pulse CKI is divided into four regions, i.e., regions A, B, C and D. In region A, the reference clock pulse CKI is 1, and the reference clock pulse CKQ is 0; in region B, the reference clock pulse CKI is 1, and the reference clock pulse CKQ is 1. Also, in region C, the reference clock pulse CKI is 0, and the reference pulse CKQ is 1; and in region D, the reference clock pulse CKI is 1, and the reference clock pulse CKQ is 0. Thus, the continuous occurrence of the two consecutive transitions of the data signal DATA (i.e. positive and negative conversions) in region A and then region D indicates that the frequency of the reference clock pulse CKI is too low. Therefore, the control signal UP has to be enabled so as to increase the frequency of the reference clock pulse CKI. While the continuous occurrence of the two consecutive transitions of the data signal DATA (i.e. positive and negative transitions) in region D and then region A indicates that the frequency of the reference clock pulse CKI is too high. Therefore, the control signal DOWN has to be enabled so as to decrease the frequency of the reference clock pulse CKI. As shown FIG. 3, P1 and P3 represent respectively the state of the reference clock pulse CKI and CKQ at the first signal transition of the data signal DATA, while Q1 and Q2 represent respectively the state of reference clock pulse CKI and CKQ at the first signal transition of the data signal DATA.

Thus, based on this principle, the situation when P1 is 1 and P2 is 0 indicates that the first data signal DATA is triggering in region A while the situation when both Q1 and Q2 are 0 indicates that the second data signal DATA triggers in region D. At this moment, the control signal UP is enabled. The situation when both P1 and P2 are 0 indicates that the second data signal DATA triggers in region D while the situation when Q1 is 1 and Q2 is 0 indicates that the second data signal DATA triggers in region A. At this moment, the control signal DOWN is enabled. In other situations, both the control signals UP and DOWN are 0. Thus, the logic circuit 13 of FIG. 3 is in accordance with the above-mentioned output requirements which uses the inverter and the AND gate to output the control signals UP and DOWN.

Figure 5:
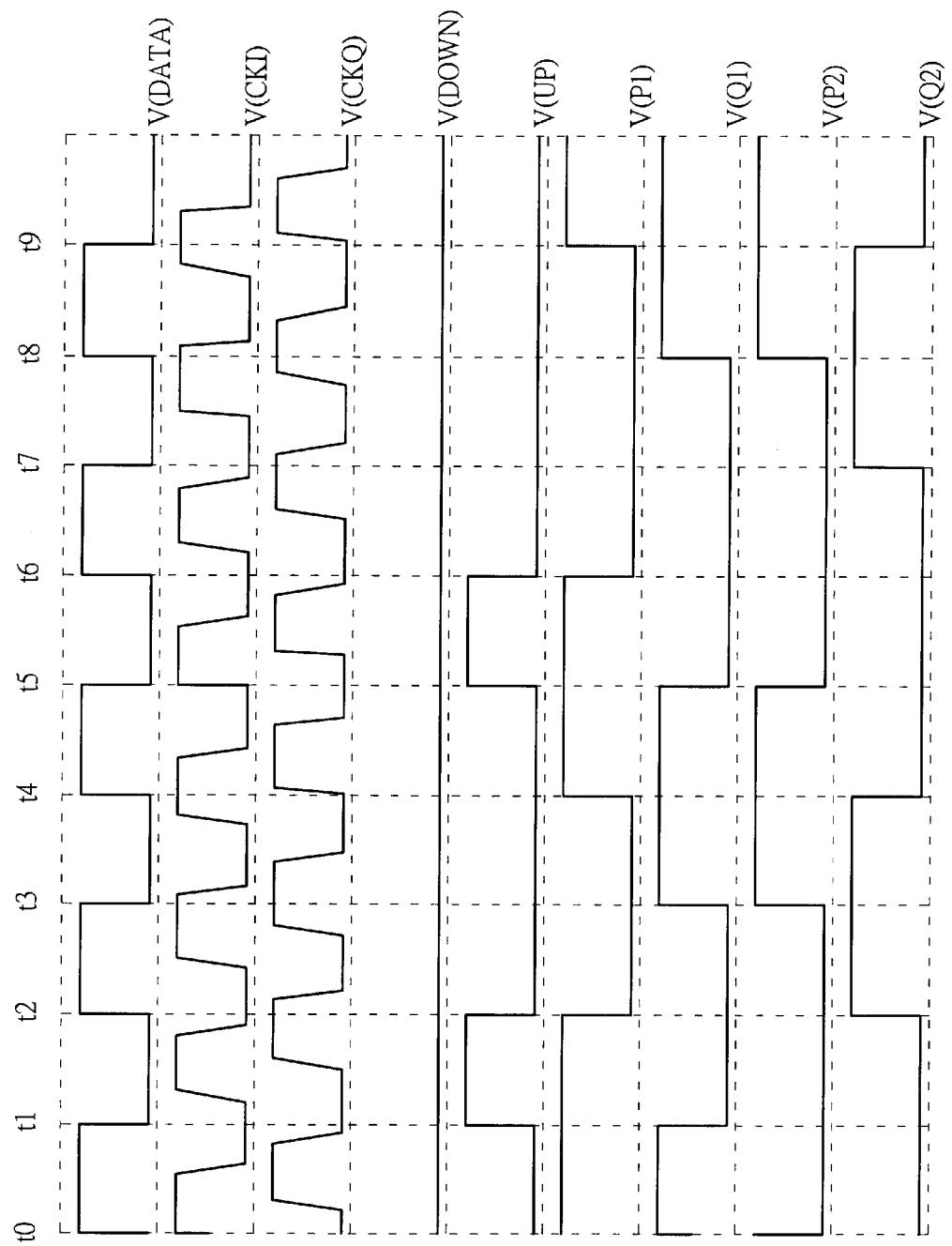
FIG. 5 shows the waveform of the invention when the output frequency of the voltage-controlled oscillator is lower than the data transmission frequency.
Figure 6:
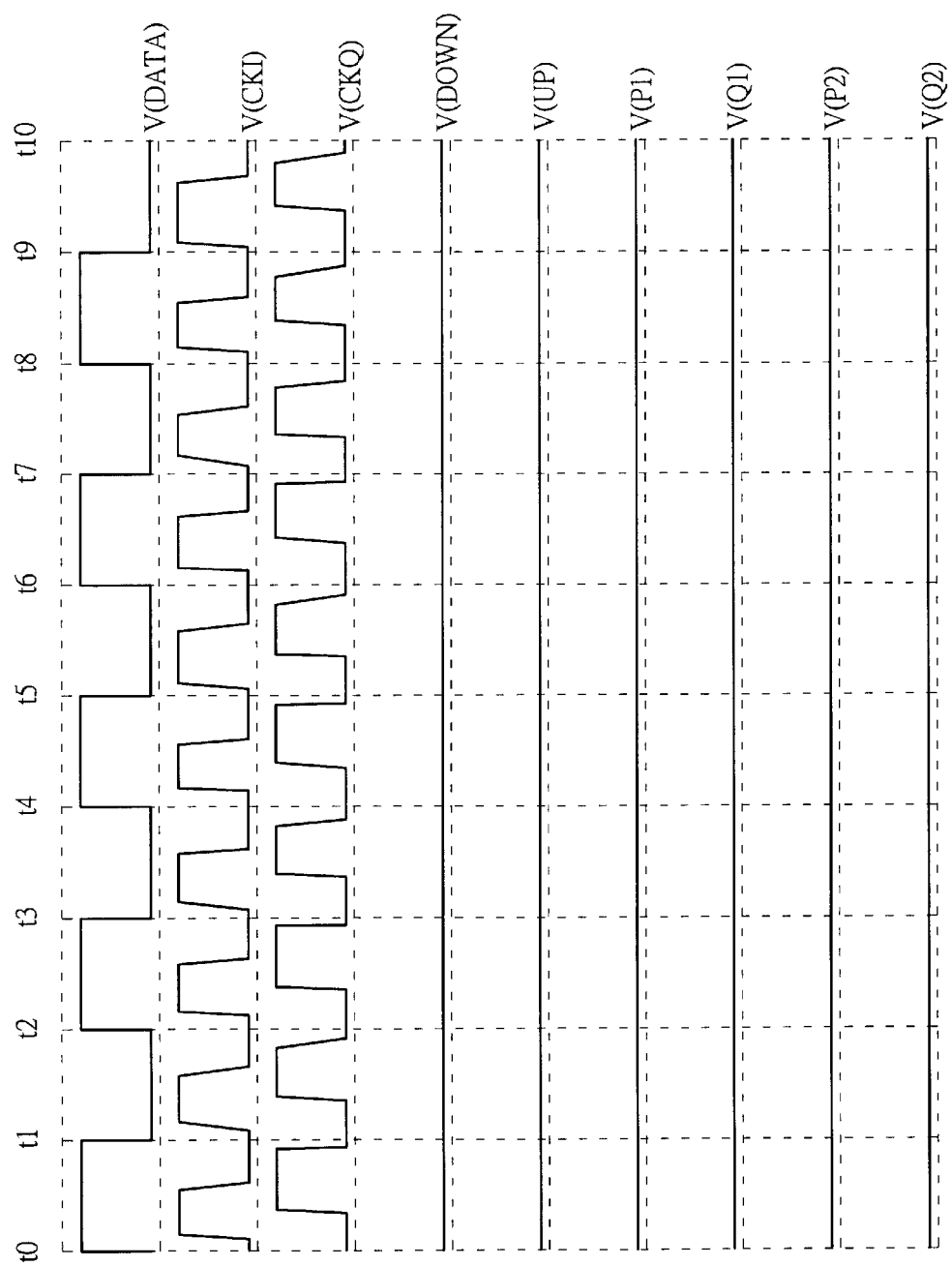
FIG. 6 shows the waveform of the invention when the output frequency of the voltage-controlled oscillator is equal to the data transmission frequency.
Figure 7:
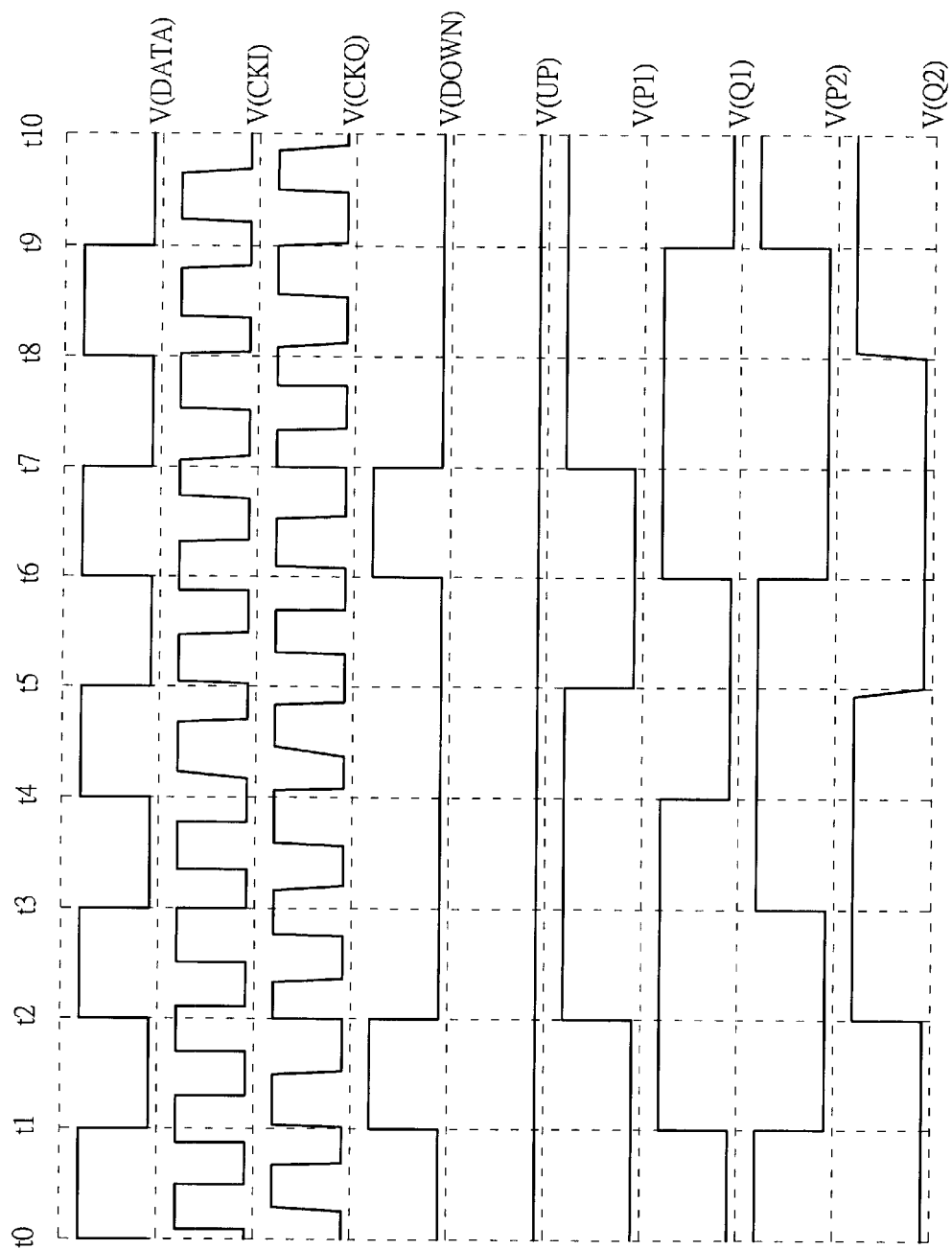
FIG. 7 shows the waveform of the invention when the output frequency of the voltage-controlled oscillator is higher than the data transmission frequency.

FIGS. 5 to 7 show the action of the digital frequency comparator of the invention. FIG. 5 shows the waveform of the invention when the output frequency of the voltage-controlled oscillator is lower than the data transmission frequency. As shown in the FIG. 5, during the period t1 to t2 and the period t5 to t6, the situation that both P1 and P2 are 0 indicates that the first transition of data signal DATA is in region A. Moreover, the situation that both Q1 and Q2 are both 0 indicates that the second transition of data signal DATA is in region D. Thus, based on the control of logic circuit 13, the control signal UP is 1 and the control sign DOWN is 0. In other time periods, both the control signals UP and DOWN are 0. Since the UP control signal is 1 in a certain period of time, the frequency of the output clock pulse CKI of the voltage-controlled oscillator will increase gradually until the frequency synchronize with the transmission frequency of the data signal DATA.

FIG. 6 shows the waveform of the invention when the output frequency of the voltage-controlled oscillator is equal to the data transmission frequency. As shown in FIG. 6, since the situation when P1, Q1, P2 and Q2 are all 0, the control signals UP and DOWN are all 0 based on the control of the logical circuit 13. Therefore, it is not necessary to adjust the frequency of the output reference clock pulse of the voltage-controlled oscillator.

FIG. 7 shows the waveform of the invention when the output frequency of the voltage-controlled oscillator is higher than the data transmission frequency. As shown in FIG. 7, during the period t1 to t2 and the period t5 to t6, the situation that both P1 and P2 are 0 indicates that the first transition of the signal DATA is in region D. Moreover, the situation that both Q1 and Q2 are 0 indicates that the second transition of data signal DATA is in region A. Thus, based on the control of logic circuit 13, the control signal UP is 0 and the control signal DOWN is 1. In other time periods, both the control signals UP and DOWN are 0. Since in a certain period of time of the DOWN control signal is 1, the frequency of the output clock pulse CKI of the voltage-controlled oscillator will decrease gradually until the frequency synchronize with the transmission frequency of the data signal DATA.

The digital frequency comparator of the invention which can be used in the non-return to zero data transmission for clock recovery only makes use of 4 flip-flops to obtain the function of a common digital frequency comparator. Although the invention employs 4 multiplexers, the design of the multiplexer and the gate counts are far smaller than the flip-flops. In view of the above, the present digit frequency comparator has the advantages of high speed, simple design and low cost of production.

While the invention has been described with respect to a preferred embodiment, it will be clear to those skilled in the art that modifications and improvements may be made to the invention without departing from the spirit and scope of the invention. Therefore, the invention is not to be limited by the specific illustrative embodiment, but only by the scope of the appended claims.

What is claimed is:

1. A digital frequency comparator comprising:
a first double-edge triggered flip-flop for receiving a first reference clock pulse and a data signal, wherein positive and negative triggers of the data signal are employed so as to output first and second state signals of the first reference clock pulse;
a second double-edge triggered flip-flop for receiving a second reference clock pulse that lags behind the first reference clock pulse and the data signal, wherein the positive and negative triggers of the data signal are employed to output first and second state signals of the second reference clock pulse; and
a combination logic for receiving the first and second state signals of the first double-edge triggered flip-flop and the second double-edge triggered flip-flop, and enabling an UP signal when the transmission frequency of the data signal is higher than the frequency of the first reference clock pulse, as well as enabling a DOWN signal when the transmission frequency of the data signal is lower than the frequency of the first reference clock pulse;
wherein the first double-edge triggered flip-flop includes,
a first D-type flip-flop having a D-input end receiving the first reference clock pulse, and the data signal being used as the positive trigger;
a second D-type flip-flop having a D-input end receiving the first reference clock pulse, and the reverse of the data signal being used as the positive trigger;
a first multiplexer connecting to the Q output ends of the first D-type flip-flop and the second D-type flip-flop, and using the reverse of the data signal as a selecting signal, and outputting the output of the first D-type flip-flop when the data signal is 1, and outputting the output of the second D-type flip-flop when the data signal is 0; and
a second multiplexer connecting to the Q output ends of the first D-type flip-flop and the second D-type flip-flop, and using the data signal as a selecting signal, and outputting the output of the first D-type flip-flop when the data signal is 0, and outputting the output of the second D-type flip-flop when the data signal is 1.

2. The digital frequency comparator as set forth in claim 1, wherein the phase angle of the second reference clock pulse lags behind the phase angle of the first reference clock pulse by 90 degrees.

3. The digital frequency comparator as set forth in claim 1, wherein the second double-edge triggered flip-flop includes:
a third D-type flip-flop having a D-input end receiving the second reference clock pulse, and the data signal being used as the positive trigger;
fourth D-type flip-flop having a D-input end receiving the second reference clock pulse, and the reverse signal of the data signal being used as the positive trigger;
a third multiplexer connecting to the Q output ends of the third D-type flip-flop and the fourth D-type flip-flop, and using the reverse of the data signal as a selecting signal, and outputting the output of the third D-type flip-flop when the data signal is 1, and outputting the output of the fourth D-type flip-flop when the data signal is 0; and
a fourth multiplexer connecting to the Q output ends of the third D-type flip-flop and the fourth D-type flip-flop, and using the data signal as a selecting signal, and outputting the output of the third D-type flip-flop when the data signal is 0, and outputting the output of the fourth D-type flip-flop when the data signal is 1.

4. The digital frequency comparator as set forth in claim 3, wherein the combination logic includes:
a first inverter for receiving the output of the first multiplexer;
a second inverter for receiving the output of the second multiplexer;
a third inverter for receiving the output of the third multiplexer;
a fourth inverter for receiving the output of the fourth multiplexer;

a first AND gate for receiving the signals output from the first inverter, the signal output from the second multiplexer, the signals output from the third inverter, and the signals output from the forth fourth inverter, and outputting a control signal UP; and a second AND gate for receiving the signal output from the first multiplexer, the signals output from the second inverter, the signals output from the third inverter, and the signals output from the fourth inverter, and outputting a control signal DOWN.

5. A digital frequency comparator comprising:

a first double-edge triggered flip-flop for receiving a first reference clock pulse and a data signal, wherein positive and negative triggers of the data signal are employed so as to output first and second state signals of the first reference clock pulse;

a second double-edge triggered flip-flop for receiving a second reference clock pulse that lags behind the first reference clock pulse and the data signal, wherein the positive and negative triggers of the data signal are employed to output first and second state signals of the second reference clock pulse; and a combination logic for receiving the first and second state signals of the first double-edge triggered flip-flop and the second double-edge triggered flip-flop, and enabling an UP signal when the transmission frequency of the data signal is higher than the frequency of the first reference clock pulse, as well as enabling a DOWN signal when the transmission frequency of the data signal is lower than the frequency of the first reference clock pulse, wherein the second double-edge triggered flip-flop includes:

a first D-type flip-flop having a D-input end receiving the second reference clock pulse, and the data signal being used as the positive trigger;

a second D-type flip-flop having a D-input end receiving the second reference clock pulse, and the reverse signal of the data signal being used as the positive trigger;

a first multiplexer connecting to the Q output ends of the first D-type flip-flop and the second D-type flip-flop, and using the reverse of the data signal as a selecting signal, and outputting the output of the first D-type flip-flop when the data signal is 1, and outputting the output of the second D-type flip-flop when the data signal is 0; and a second multiplexer connecting to the Q output ends of the first D-type flip-flop and the second D-type flip-flop, and using the data signal as a selecting signal, and outputting the output of the first D-type flip-flop when the data signal is 0, and outputting the output of the second D-type flip-flop when the data signal is 1.

6. The digital frequency comparator as set forth in claim 5, wherein the phase angle of the second reference clock pulse lags behind the phase angle of the first reference clock pulse by 90 degrees.

7. The digital frequency comparator as set forth in claim 5, wherein the first double-edge triggered flip-flop includes:

a third D-type flip-flop having a D-input end receiving the first reference clock pulse, and the data signal being used as the positive trigger;

a fourth D-type flip-flop having a D-input end receiving the first reference clock pulse, and the reverse of the data signal being used as the positive trigger;

a third multiplexer connecting to the Q output ends of the third D-type flip-flop and the fourth D-type flip-flop, and using the reverse of the data signal as a selecting signal, and outputting the output of the third D-type flip-flop when the data signal is 1, and outputting the output of the fourth D-type flip-flop when the data signal is 0; and a fourth multiplexer connecting to the Q output ends of the third D-type flip-flop and the fourth D-type flip-flop, and using the data signal as a selecting signal, and outputting the output of the third D-type flip-flop when the data signal is 0, and outputting the output of the fourth D-type flip-flop when the data signal is 1.

8. The digital frequency comparator as set forth in claim 7, wherein the combination logic includes:

a first inverter for receiving the output of the first multiplexer;

a second inverter for receiving the output of the second multiplexer;

a third inverter for receiving the output of the third multiplexer;

a fourth inverter for receiving the output of the fourth multiplexer;

a first AND gate for receiving the signals output from the first inverter, the signals output from the second inverter, the signals output from the third inverter, and the signal output from the fourth multiplexer, and outputting a control signal UP; and a second AND gate for receiving the signals output from the first inverter, the signals output from the second inverter, the signal output from the third multiplexer, and the signals output from the fourth inverter, and outputting a control signal DOWN.

* * * * *